(12) United States Patent
Wu et al.

(10) Patent No.: US 12,232,258 B2
(45) Date of Patent: Feb. 18, 2025

(54) ELECTRONIC DEVICE

(71) Applicant: InnoLux Corporation, Miao-Li County (TW)

(72) Inventors: Shang-Ru Wu, Miao-Li County (TW); Hua-Pin Chen, Miao-Li County (TW); Shuai Wang, Miao-Li County (TW); Chien-Hao Kuo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 198 days.

(21) Appl. No.: 17/938,403

(22) Filed: Oct. 6, 2022

(65) Prior Publication Data

US 2023/0156916 A1   May 18, 2023

Related U.S. Application Data

(60) Provisional application No. 63/278,509, filed on Nov. 12, 2021.

(30) Foreign Application Priority Data

Aug. 25, 2022 (CN) .......................... 202211026803.5

(51) Int. Cl.
*H05K 1/11* (2006.01)
*H05K 1/18* (2006.01)

(52) U.S. Cl.
CPC .............. *H05K 1/111* (2013.01); *H05K 1/117* (2013.01); *H05K 1/181* (2013.01); *H05K 2201/094* (2013.01); *H05K 2201/09409* (2013.01); *H05K 2201/09418* (2013.01); *H05K 2201/09427* (2013.01); *H05K 2201/10128* (2013.01); *H05K 2201/10287* (2013.01)

(58) Field of Classification Search
CPC ......... H05K 1/111; H05K 1/117; H05K 1/181
See application file for complete search history.

(56) References Cited

U.S. PATENT DOCUMENTS

| 7,903,067 | B2 | 3/2011 | Yoo |
| 9,591,754 | B2 | 3/2017 | Lee |
| 9,773,771 | B2 | 9/2017 | Wu et al. |
| 2011/0193239 | A1* | 8/2011 | Horiguchi ............. H05K 1/111 257/773 |

FOREIGN PATENT DOCUMENTS

| CN | 106571116 A | 4/2017 |
| CN | 112768473 A | 5/2021 |
| TW | 200530676 A | 9/2005 |
| TW | M605386 U | 12/2020 |

OTHER PUBLICATIONS

Chinese language office action dated May 17, 2024, issued in application No. TW 111135287.

* cited by examiner

*Primary Examiner* — Jeremy C Norris
(74) *Attorney, Agent, or Firm* — McClure, Qualey & Rodack, LLP

(57) ABSTRACT

An electronic device is provided, including a substrate, and a plurality of first bonding pads. The substrate includes a bonding area. The plurality of first bonding pads are disposed on the substrate and disposed in the bonding area. A part of the plurality of first bonding pads are arranged along a first direction, and another part of the plurality of first bonding pads are arranged along a second direction. There is an included angle between the first direction and the second direction, and the included angle is greater than 0 degrees and less than 90 degrees.

19 Claims, 8 Drawing Sheets

ELECTRONIC DEVICE

CROSS REFERENCE TO RELATED APPLICATIONS

This application claims the benefit of U.S. Provisional Application No. U.S. 63/278,509, filed Nov. 12, 2021, the entirety of which is incorporated by reference herein.

This Application claims priority of China Patent Application No. 202211026803.5, filed on Aug. 25, 2022, the entirety of which is incorporated by reference herein.

BACKGROUND OF THE INVENTION

Field of the Invention

The present invention relates to an electronic device, and, in particular, to an electronic device including a driving circuit.

Description of the Related Art

During the evolution of electronic devices, the dimensions of the electronic devices are constantly miniaturized, resulting in many unsolved problems in the process of manufacturing these electronic devices. Because the area where the driving circuit (such as an integrated circuit) is disposed may be limited by the routing requirements, the requirements of the frame cannot be met. Moreover, when bonding the driving circuit, there may be problems with it being easily deformed or cracked, stress concentration and uneven pressure. Therefore, although existing electronic devices generally meet the needs of their users, they are not satisfactory in all respects. Therefore, there is still a need to improve the structure of electronic devices in order to manufacture electronic devices that meet the product requirements.

BRIEF SUMMARY OF THE INVENTION

An embodiment of the present invention provides an electronic device, including a substrate, and a plurality of first bonding pads. The substrate includes a bonding area. The plurality of first bonding pads are disposed on the substrate and disposed in the bonding area. A part of the plurality of first bonding pads are arranged along a first direction, and another part of the plurality of first bonding pads are arranged along a second direction. There is an included angle between the first direction and the second direction, and the included angle is greater than 0 degrees and less than 90 degrees.

BRIEF DESCRIPTION OF THE DRAWINGS

The present invention may be more fully understood by reading the subsequent detailed description and examples with references made to the accompanying drawings, wherein.

DETAILED DESCRIPTION OF THE INVENTION

Figure 1:
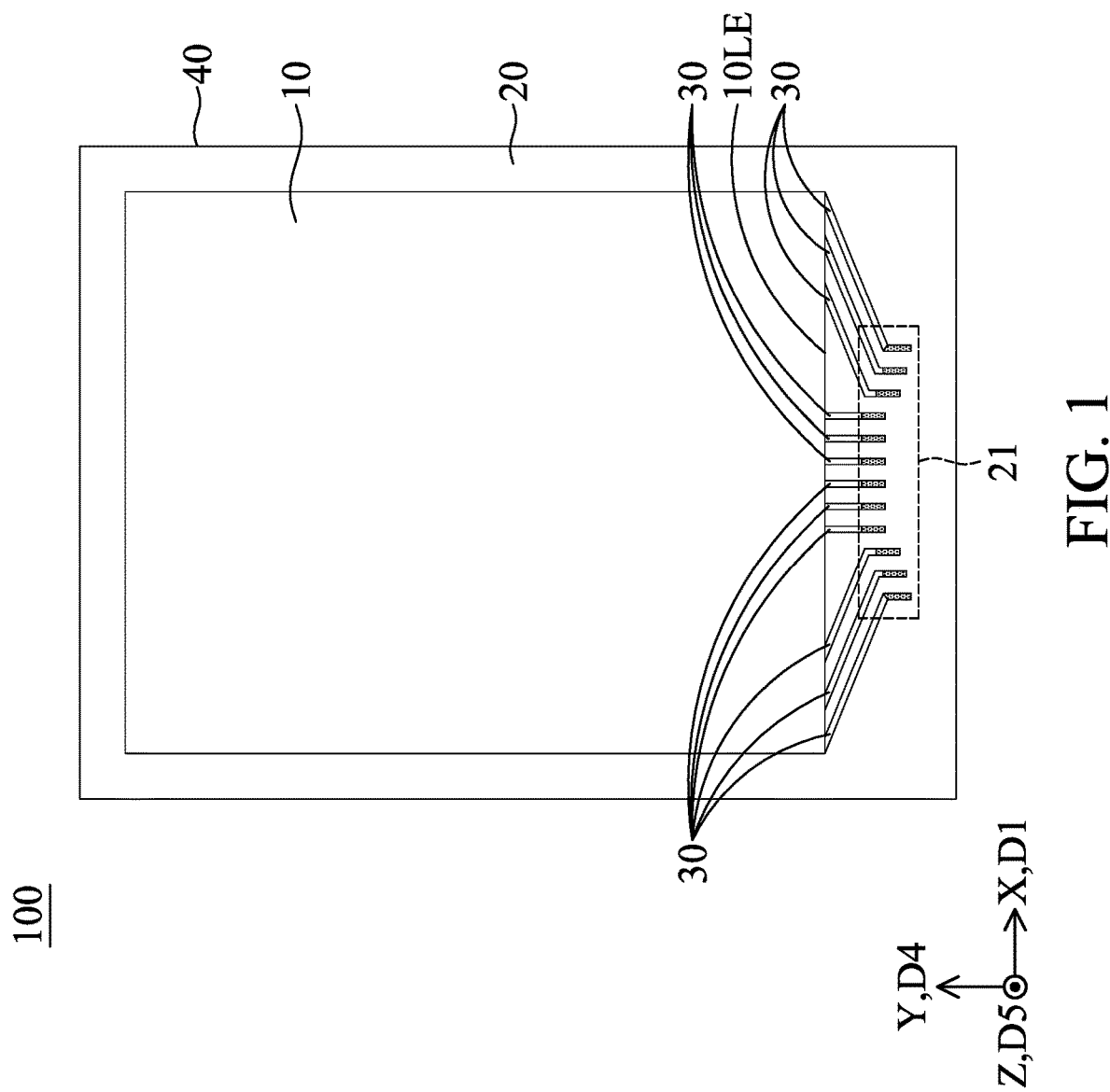
FIG. 1 shows a schematic view of an electronic device according to some embodiments of the present disclosure.

The present disclosure may be more clearly understood by referring to the following description and the appended drawings. It should be noted that, for the sake of the simplicity of the drawings and comprehensibility for readers, only a portion of the light-emitting unit is illustrated in multiple figures in the present disclosure, and the specific components in the figures are not drawn to scale. In addition, the number and size of each component in the drawings merely serve as an example, and are not intended to limit the scope of the present disclosure. Furthermore, similar and/or corresponding numerals may be used in different embodiments for describing some embodiments simply and clearly, but they do not represent any relationship between different embodiments and/or structures discussed below.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open-ended words, so they should be interpreted as meaning "including but not limited to . . . " Therefore, when the terms "including", "comprising", and/or "having" are used in the description of the disclosure, the presence of corresponding features, areas, steps, operations and/or components is specified without excluding the presence of one or more other features, areas, steps, operations and/or components.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

When a corresponding component (i.e. a film layer or area) is referred to as "on another component", it may be directly on another component, or there may be other components in between. On the other hand, when a component is referred "directly on another component", there is no component referred between the former two. In addition, when a component is referred "on another component", the two components have an up-down relationship in the top view, and this component can be above or below the other component, and this up-down relationship depends on the orientation of the device.

The terms "about," "equal to," "equivalent," "the same as," "essentially," or "substantially" are generally interpreted as within 20% of a given value or range, or as interpreted as within 10%, 5%, 3%, 2%, 1%, or 0.5% of a given value or range.

It should be understood that, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. If the first value is equal to the second value, the deviation between the first value and the second value may be within about 10%. If the first direction is perpendicular to the second direction, the angle between the first direction and the second direction may be between 80 degrees (≥80 degrees) and 100 degrees (≤100 degrees). If the first direction is parallel to the second direction, the angle between the first direction and the second direction may be between 0 degree (≥0 degree) and 10 degrees (≤10 degrees).

It should be noted that the technical solutions provided by different embodiments below may be interchangeable, combined or mixed to form another embodiment without departing from the spirit of the present disclosure.

Unless defined otherwise, all terms (including technical and scientific terms) used herein have the same meaning as commonly understood by one having ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

The electronic device of the present disclosure may include, but is not limited to, a display device, an antenna device, a sensing device, a lighting device, or a splicing device. Electronic devices may include bendable or flexible electronic devices. Electronic devices may include electronic elements. The electronic device includes, for example, a liquid crystal layer or a light-emitting diode (LED). Electronic elements may include passive and active components, such as capacitors, resistors, inductors, diodes, transistors, inductors, and the like. The diodes may include light-emitting diodes or photodiodes. The light-emitting diodes may include, for example, organic light-emitting diodes (OLEDs), sub-millimeter light-emitting diodes (mini LEDs), micro light-emitting diodes (micro LEDs), quantum dot light-emitting diodes (quantum dot LED), fluorescence, phosphor, or other suitable materials, or combinations thereof, but not limited thereto. Sensors may include, for example, capacitive sensors, optical sensors, electromagnetic sensors, fingerprint sensors (FPS), touch sensors, antenna, or pen sensor, etc., but not limited to. Hereinafter, the present disclosure will be described by taking the display device as the electronic device, but the present disclosure is not limited thereto.

Please refer to FIG. 1, FIG. 1 shows a schematic view of an electronic device 100 according to some embodiments of the present disclosure. The electronic device 100 may be a computer, a tablet, a wearable computer (for example, a smart watch, a smart bracelet, smart glasses, etc.), a smart phone, a traditional cell phone, a display device (e.g., a monitor, a virtual reality headset), etc., but not limited to thereto.

As shown in FIG. 1, the electronic device 100 may include a substrate 40, and the substrate 40 includes a working area 10 and a peripheral area 20. The working area 10 may be, for example, an active area or a display area. For example, the electronic device may further include a plurality of sub-pixels (not shown) or/and a plurality of light-emitting units (not shown) disposed on the substrate 40, and the area surrounded by the outermost edges of the plurality of sub-pixels is the working area 10, the area other than the working area 10 is the peripheral area 20. The peripheral area 20 may be an inactive area or a non-display area. The electronic device 100 may further include a wire 30 disposed on the substrate 40, and the material of the wire 30 may include, for example, molybdenum (Mo), titanium (Ti), tantalum (Ta), niobium (Nb), hafnium (Hf), nickel (Ni), chromium (Cr)), cobalt (Co), zirconium (Zr), tungsten (W), aluminum (Al), copper (Cu), silver (Ag), other suitable metals, metal oxides (e.g., indium tin oxide, indium zinc oxide, aluminum tin oxide, aluminum zinc oxide, indium germanium zinc oxide) or alloys or combinations of the above materials, the present disclosure is not limited thereto, and the wire 30 may transmit current and/or signals. In some embodiments, the thin film transistor may be disposed on the substrate 40. In other embodiments, the electronic device further includes another substrate (not shown) corresponding to the substrate 40, and a display medium may be provided between the substrate 40 and the other substrate, and the present disclosure is not limited thereto.

According to some embodiments of the present disclosure, the peripheral area 20 is adjacent to the working area 10. For example, the peripheral area 20 may be located at the periphery of the working area 10, and the peripheral area 20 may surround the working area 10. The wire 30 may connect the working area 10 and the peripheral area 20. For example, the wire 30 may electrically connect the pixels (or the light-emitting units) disposed on the working area 10 and the electronic elements of the peripheral area 20 to each other to allow current and/or signal transmission between the working area 10 and the peripheral area 20.

Figure 2:
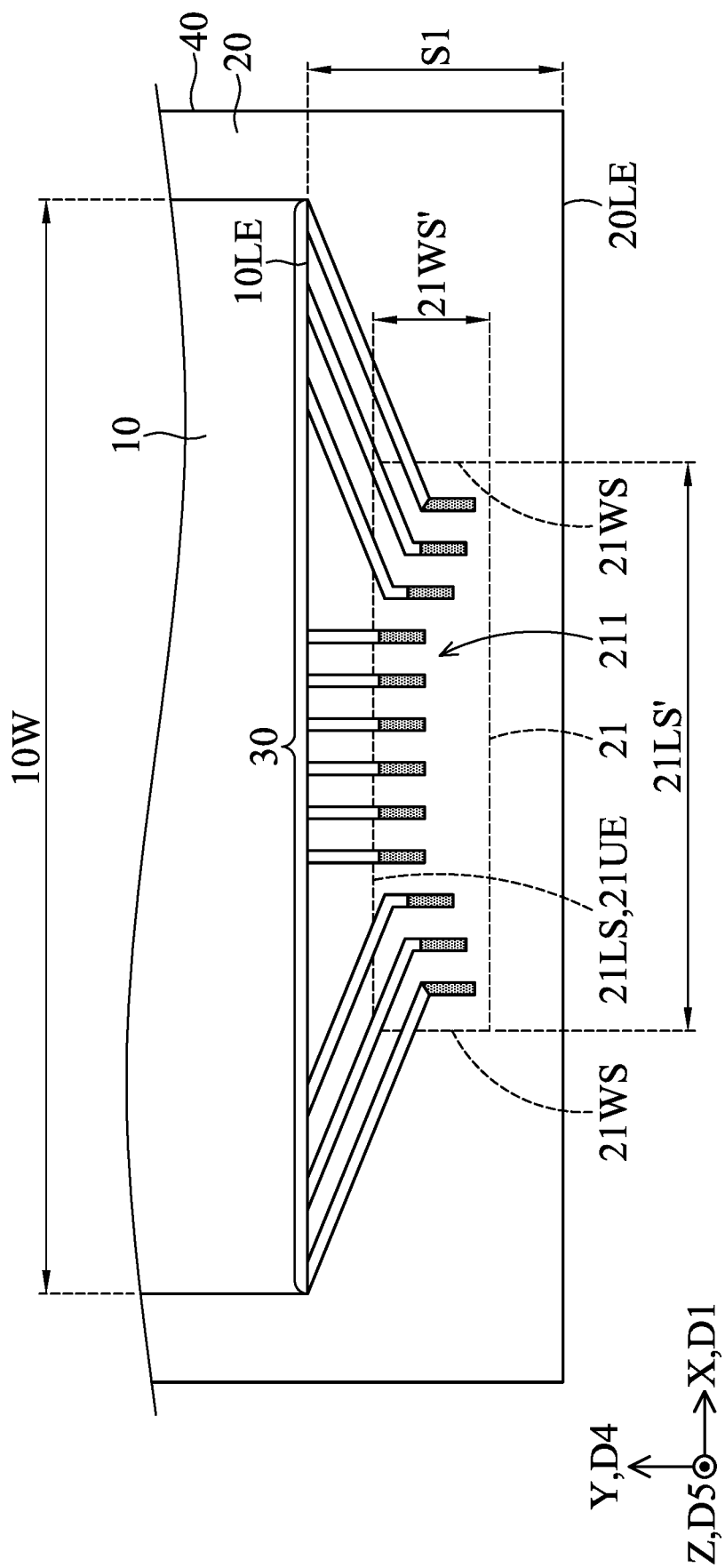
FIG. 2 shows a partial enlarged view of the lower portion of the electronic device of FIG. 1 according to some embodiments of the present disclosure.

Please refer to FIG. 2, FIG. 2 shows a partial enlarged view of the lower portion of the electronic device 100 of FIG. 1 according to some embodiments of the present disclosure. As shown in FIG. 2, there may be a distance S1 between the lower edge 10LE of the working area 10 and the lower edge 20LE of the peripheral area 20; and the working area 10 may have a width 10W. According to some embodiments of the present disclosure, the lower edge 20LE of the peripheral area 20 may be the lower edge of the substrate 40 of the electronic device 100.

Please continue to refer to FIG. 2, the peripheral area 20 may include a bonding area 21. It should be noted that, for ease of understanding, in FIG. 2, the range of the bonding area 21 is indicated by dotted lines. As shown in FIG. 2, the bonding area 21 may be located between the lower edge 10LE of the working area 10 and the lower edge 20LE of the peripheral area 20. According to some embodiments of the present disclosure, the bonding area 21 may not be in contact with the lower edge 10LE of the working area 10 or the lower edge 20LE of the peripheral area 20.

As shown in FIG. 2, the bonding area 21 may be connected to the pixels in the working area 10 by the wire 30, so as to allow current and/or signal transmission between the working area 10 and the bonding area 21.

Please refer to FIG. 2, according to some embodiments of the present disclosure, the bonding area 21 may be, for example, an area that is corresponding to a driving circuit (e.g., an integrated circuit).

According to some embodiments of the present disclosure, the distance S1 may be less than 3200 micrometers. According to some embodiments of the present disclosure, please refer to FIG. 2, the width 21LS' of the bonding area 21 along the first direction D1 (e.g., the maximum width along the first direction D1) may be less than or equal to the width 10W of the working area 10 along the first direction D1 (for example, the maximum width in the first direction D1). In some other embodiments, the width 21LS' of the bonding area 21 may also be regarded as the width of the driving circuit (e.g., the integrated circuit) in the first direction D1, but the present disclosure is not limited thereto. According to some embodiments of the present disclosure, the ratio of the width 21LS' of the bonding area 21 to the width 10W of the working area 10 (21LS'/10W) may be between 0 and 1 (0≤21LS'/10W≤1). According to some embodiments of the present disclosure, the ratio (21LS'/10W) of the width 21LS' of the bonding area 21 to the width 10W of the working area 10 may be between 0.172 and 0.258 (0.172≤21LS'/10W≤0.258). The first direction D1 of the present disclosure may be, for example, the extension direction of the gate line (not shown), the fourth direction D4 may be, for example, perpendicular to the first direction D1, and the fifth direction D5 may be perpendicular to the first direction D1 and the fourth direction D4, and the fifth direction D5, for example, the normal direction of the electronic device 100, but the present disclosure is not limited thereto.

Figure 3:
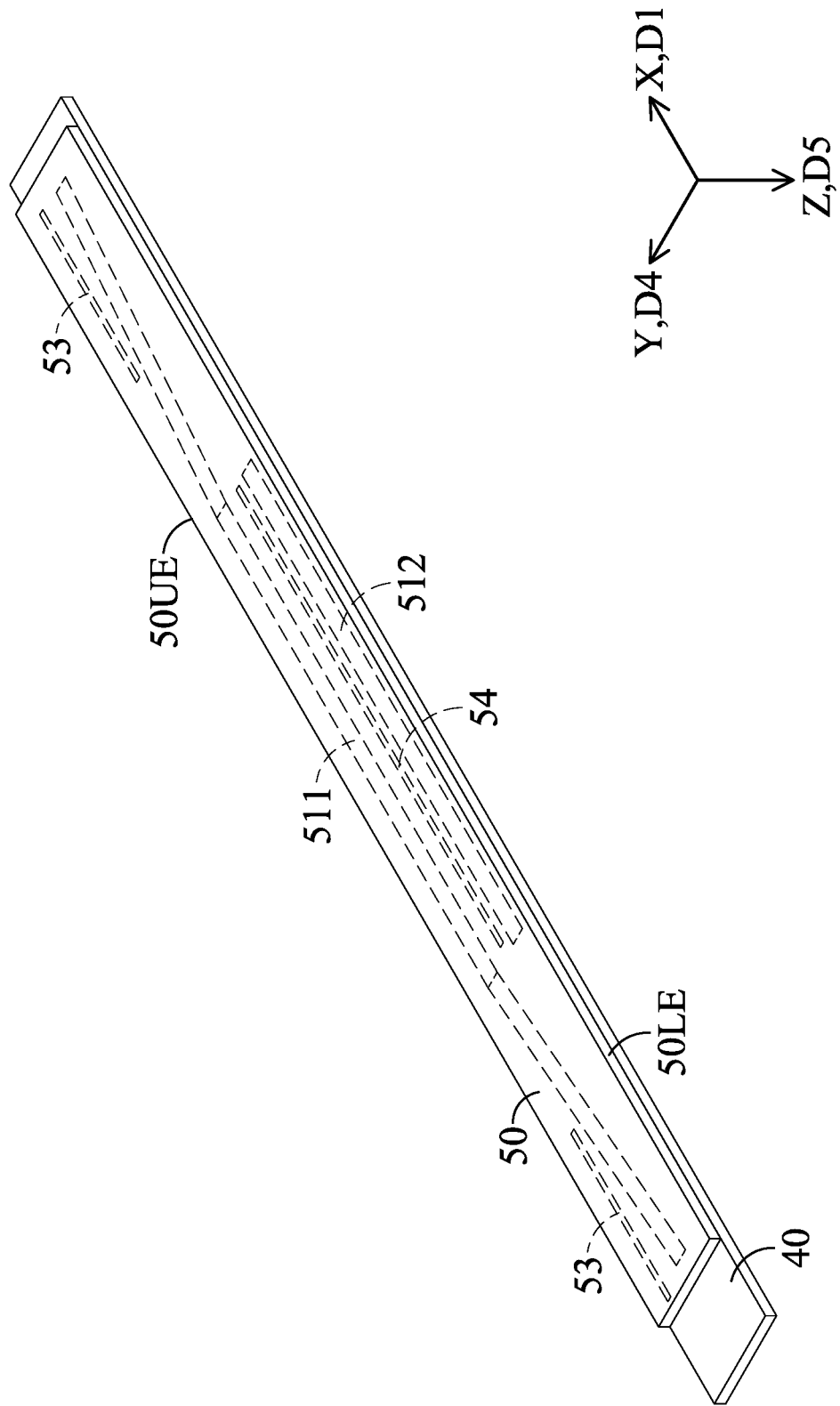
FIG. 3 is a perspective view of a bonding pad of a driving circuit according to some embodiments of the present disclosure.

Please refer to FIG. 3. FIG. 3 is a perspective view of a bonding pad of a driving circuit according to some embodiments of the present disclosure. As shown in FIG. 3, the electronic device 100 may further include a driving circuit 50. The driving circuit 50 may be disposed on the substrate 40 and corresponding to the bonding area 21 on the substrate 40, and the bonding pads of the driving circuit 50 (the configuration of which may refer to FIG. 4) may correspond to the bonding pads on the substrate 40 (the configuration of which may refer to FIG. 5), and they are electrically connected to each other. FIG. 3 is a perspective view of the bonding pads that may see through to the lower surface of the driver circuit 50.

As shown in FIG. 3, the driving circuit 50 may include a plurality of first bonding pads 511, a plurality of second bonding pads 521, a plurality of first dummy bonding pads 53, and a plurality of second dummy bonding pads 54. However, the detail of the configuration of the first bonding pads 511, the second bonding pads 521, the first dummy bonding pads 53, and the second dummy bonding pads 54 will be described with reference to FIG. 4.

Figure 4:
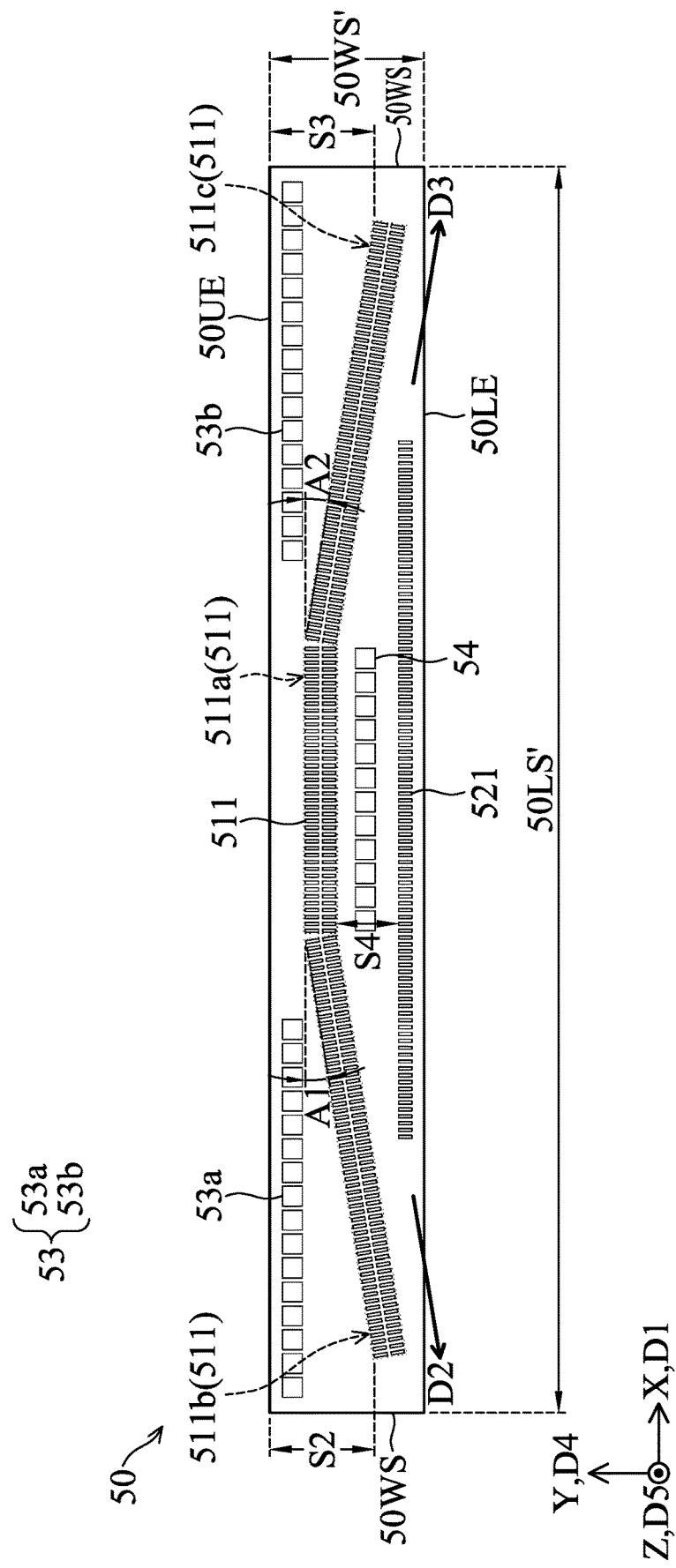
FIG. 4 shows a schematic view of the configuration of bonding pads of the driving circuit (e.g., integrated circuit) according to some embodiments of the present disclosure.

Please refer to FIG. 4, FIG. 4 shows a schematic view of the configuration of bonding pads of the driving circuit 50 (e.g., integrated circuit) according to some embodiments of the present disclosure. In some other embodiments, the driving circuit 50 may include an integrated circuit, a flexible printed circuit board (FPC), or a chip on film (COF), or a combination thereof, but the present disclosure is not limited thereto.

Please continue to refer to FIG. 4, the plurality of second bonding pads 521 may be disposed farther away from the upper edge 50UE of the driving circuit 50 than the plurality of first bonding pads 511. For example, the plurality of second bonding pads 521 may be disposed further away from the working area 10 than at least part of the plurality of first bonding pads 511. Furthermore, at least a part of the first bonding pad 511 is disposed between the upper edge 50UE and the second bonding pad 521. At least a part of the first dummy pads 53 may be disposed between the first bonding pad 511 and the upper edge 50UE. The second dummy pads 54 may be disposed between the first bonding pad 511 and the second bonding pad 521.

A first portion 511a of the first bonding pads 511 is arranged along the first direction D1 (for example, may be the X-axis), and a second portion 511b of the first bonding pads 511 is arranged along the second direction D2 (as shown by the arrow in FIG. 4), and a third portion 511c of the first bonding pads 511 is arranged along the third direction D3 (as shown by the arrow in FIG. 4). It should be noted that, for ease of understanding, in FIG. 4, the ranges of the first portion 511a, the second portion 511b, and the third portion 511c are represented by dotted blocks, respectively.

Referring to FIG. 4, in some embodiments, the upper edge 50UE of the driving circuit 50 may be parallel to the first direction D1, and the side 50WS of the driving circuit 50 may be extended along the fourth direction D4 (e.g., may be the Y axis), but the present disclosure is not limited thereto. According to some embodiments of the present disclosure, the upper edge 50UE of the driving circuit 50 may be perpendicular to the side 50WS of the driving circuit 50, but the present disclosure is not limited thereto.

According to some embodiments of the present disclosure, there is an included angle A1 between the first direction D1 and the second direction D2, and the included angle A1 is greater than 0 degrees and less than 90 degrees (0°<A1<90°). According to some embodiments of the present disclosure, there is an included angle A2 between the first direction D1 and the third direction D3, and the included angle A2 is greater than 0 degrees and less than 90 degrees (0°<A2<90°).

According to some embodiments of the present disclosure, the included angle A1 between the first direction D1 and the second direction D2 may be greater than or equal to 2 degrees and less than or equal to 20 degrees (2°≤A1≤20°). According to some embodiments of the present disclosure, the included angle A2 between the first direction D1 and the third direction D3 may be greater than or equal to 2 degrees and less than or equal to 20 degrees (2°≤A2≤20°).

As shown in FIG. 4, the second portion 511b of the first bonding pads 511 and the third portion 511c of the first bonding pads 511 may be located on both sides of the first portion 511a of the first bonding pads 511, respectively. For example, the second portion 511b of the first bonding pads 511 and the third portion 511c of the first bonding pads 511 may be located on the left side and right side of the first portion 511a of the first bonding pads 511, respectively.

Also, according to some embodiments of the present disclosure, the second portion 511b of the first bonding pads 511 may be disposed adjacent to the first portion 511a of the first bonding pads 511, so that the second portion 511b of the first bonding pads 511 and the first portion 511a of the first bonding pads 511 is continuous.

Likewise, according to some embodiments of the present disclosure, the third portion 511c of the first bonding pads 511 may be disposed adjacent to the first portion 511a of the first bonding pads 511, such that the third portion 511c of the first bonding pads 511 and the first portion 511a of the first bonding pads 511 is continuous.

That is, the first portion 511a of the first bonding pads 511, the second portion 511b of the first bonding pads 511, and the third portion 511c of the first bonding pads 511 may be continuous.

In some embodiments, the first portion 511a of the first bonding pads 511 may be parallel to the upper edge 50UE of the driving circuit 50, and the second portion 511b of the first bonding pads 511 may be away from the upper edge 50UE of the driving circuit 50 along the second direction D2, and the third portion 511c of the first bonding pads 511 may be away from the upper edge 50UE of the driving circuit 50 along the third direction D3, but the present disclosure is not limited thereto.

Please refer to FIG. 4, the end of the second portion 511b of the first bonding pads 511 may be separated from the upper edge 50UE of the driving circuit 50 by a distance S2; and the end of the third portion 511c of the first bonding pads 511 may be separated from the upper edge 50UE of the driving circuit 50 by a distance S3. For example, the bonding pad of the second portion 511b of the first bonding pads 511 that is closest to the side 50WS is separated from the upper edge 50UE of the driving circuit 50 by a minimum distance S2 in a direction that is perpendicular to the first direction D1 (e.g., the fourth direction D4). The bonding pad of the third portion 511c of the first bonding pads 511 that is closest to the side 50WS is separated from the upper edge 50UE of the driving circuit 50 by a minimum distance S3 in a direction that is perpendicular to the first direction D1 (e.g., the fourth direction D4).

According to some embodiments of the present disclosure, the distance S2 between the end of the second portion 511b of the first bonding pads 511 and the upper edge 50UE of the driving circuit 50 may be equal to the distance S3 between the end of the third portion 511c of the first bonding pads 511 and the upper edge 50UE of the drive circuit 50 (S2=S3).

According to some embodiments of the present disclosure, the distance S2 between the end of the second portion 511b of the first bonding pads 511 and the upper edge 50UE of the driving circuit 50 may be greater than the distance S3 between the end of the third portion 511c of the first bonding pads 511 and the upper edge 50UE of the drive circuit 50 (S2>S3).

According to some embodiments of the present disclosure, the distance S2 between the end of the second portion 511b of the first bonding pads 511 and the upper edge 50UE of the driving circuit 50 may be smaller than the distance S3 between the end of the third portion 511c of the first bonding pads 511 and the upper edge 50UE of the drive circuit 50 (S2<S3).

As shown in FIG. 4, according to some embodiments of the present disclosure, the distance S2 between the end of the second portion 511b of the first bonding pads 511 and the upper edge 50UE of the driving circuit 50 may be greater than 0 micrometers to less than or equal to the width 50WS' of the side 50WS of the driving circuit 50 (0 micrometers<S2≤50WS').

According to some embodiments of the present disclosure, the distance S2 between the end of the second portion 511b of the first bonding pads 511 and the upper edge 50UE of the driving circuit 50 may be greater than or equal to 400 micrometers to less than or equal to half of the width 50WS' of the side 50WS of the driving circuit 50 (400 micrometers≤S2≤½×50WS').

According to some embodiments of the present disclosure, the range of the distance S3 between the end of the third portion 511c of the first bonding pads 511 and the upper edge 50UE of the drive circuit 50 may be the same as or similar to the above-mentioned distance S2, which will not be repeated here.

Please continue to refer to FIG. 4, the second bonding pads 521 may be disposed close to the lower edge 50LE of the driving circuit 50, and the second bonding pads 521 may be arranged along the first direction D1.

Please continue to refer to FIG. 4, the first portion 511a of the first bonding pads 511 may be separated from the second bonding pads 521 by a distance S4 (for example, the minimum distance in the fourth direction D4). According to some embodiments of the present disclosure, the distance S4 between the first portion 511a of the first bonding pads 511 and the second bonding pads 521 may be greater than 0 micrometers and less than or equal to the width 50LS' of the driving circuit 50 (0 micrometers<S4≤50LS').

According to some embodiments of the present disclosure, the distance S4 between the first portion 511a of the first bonding pads 511 and the second bonding pads 521 may be greater than or equal to 500 micrometers and less than or equal to half of the width 50LS' of the driving circuit 50 (500 micrometers≤S4<½×50LS').

As shown in FIG. 4, the first dummy pads 53 may include a first portion 53a and a second portion 53b. According to some embodiments of the present disclosure, the first portion 53a and/or the second portion 53b of the first dummy pads 53 may be arranged along the first direction D1.

Please continue to refer to FIG. 4, the first portion 53a of the first dummy pads 53 may be disposed adjacent to the upper edge 50UE of the driving circuit 50, and the first portion 53a of the first dummy pads 53 may be disposed between the second portion 511b of the first bonding pads 511 and the upper edge 50UE of the driving circuit 50.

The second portion 53b of the first dummy pads 53 may be disposed adjacent to the upper edge 50UE of the driving circuit 50, and the second portion 53b of the first dummy pads 53 may be disposed between the third portion 511c of the first bonding pads 511 and the upper edge 50UE of the driving circuit 50. The disposition of the first dummy pads 53 and/or the second dummy pads 54 may reduce the probability of deformation, cracking, stress concentration, and uneven pressure of the driving circuit 50, so that the electronic device 100 has better reliability.

Figure 5:
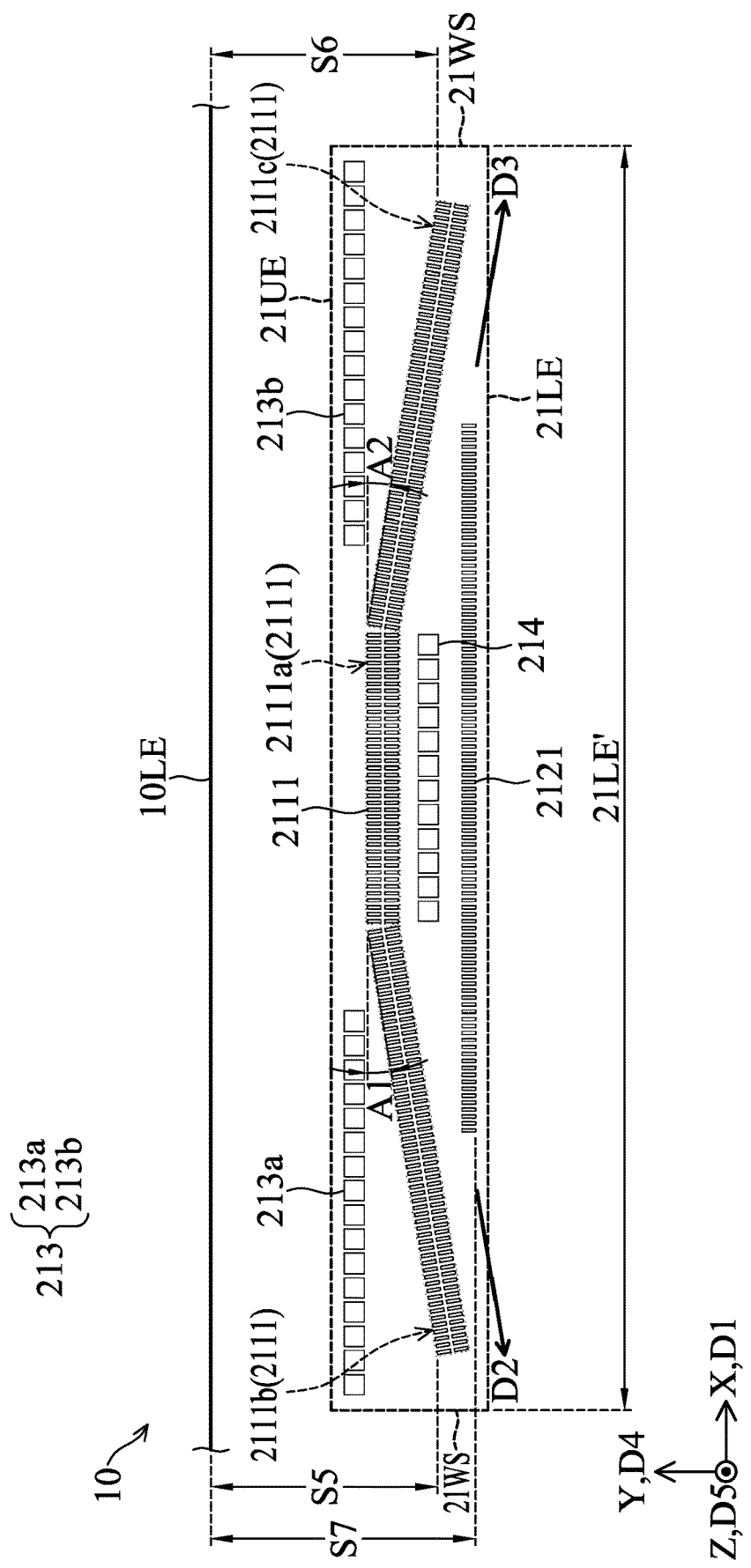
FIG. 5 shows a schematic view of disposition of the driving circuit corresponding to the bonding area and a part of the working area according to some embodiments of the present disclosure.

FIG. 5 shows a schematic view of disposition of the driving circuit on the substrate 40 that is corresponding to the bonding area 21 and a part of the working area 10 according to some embodiments of the present disclosure. As shown in FIG. 5, the electronic device 100 further includes a plurality of first bonding pads 2111, a plurality of second bonding pads 2121, a plurality of first dummy pads 213, a plurality of second dummy pads 214, wherein the plurality of first bonding pads 2111, the plurality of second bonding pads 2121, the plurality of first dummy pads 213 and the plurality of second dummy pads 214 are disposed on the substrate 40 and disposed in the bonding area 21.

The plurality of first bonding pads 2111 and/or the plurality of second bonding pads 2121 may be connected to the working area 10 by the wire 30, so as to allow current and/or signal transmission between the plurality of first bonding pads 2111 and the plurality of second bonding pads 2121 and the working area 10. However, the first dummy pads 213 and the second dummy pads 214 are not connected to the working area 10 by the wire 30, but the present disclosure is not limited thereto.

It should be noted that the first bonding pads 2111, second bonding pads 2121, the first dummy pads 213, and the second dummy pads 214 in FIG. 5 may correspond to the first bonding pads 511, the second bonding pads 521, the first dummy bonding pads 53, and the second dummy bonding pads 54. Please continue to refer to FIG. 5, the second bonding pads 2121 may be disposed further away from the working area 10 than at least part of the first bonding pads 2111. Moreover, at least part of the first bonding pads 2111 are disposed between the working area 10 and the second bonding pad area 212. And, they may have similar configurations.

Similarly, the first bonding pads 2111 may include a first portion 2111a, a second portion 2111b, and a third portion 2111c. The first portion 2111a of the first bonding pads 2111 is arranged along a first direction D1 (for example, may be the X axis), the second portion 2111b of the first bonding pads 2111 is arranged along a second direction D2, and the third portion 2111c of the first bonding pads 2111 is arranged along a third direction D3. Moreover, the first dummy pads 213 may include a first portion 213a and a second portion 213b.

It should be noted that, for ease of understanding, in FIG. 5, the ranges of the first portion 2111a, the second portion 2111b, and the third portion 2111c are represented by dotted lines, respectively.

According to some embodiments of the present disclosure, there is an included angle A1 between the first direction D1 and the second direction D2, and the included angle A1 is greater than 0 degrees and less than 90 degrees ($0°<A1<90°$). According to some embodiments of the present disclosure, there is an included angle A2 between the first direction D1 and the third direction D3, and the included angle A2 is greater than 0 degrees and less than 90 degrees ($0°<A2<90°$). According to some embodiments of the present disclosure, the included angle A1 between the first direction D1 and the second direction D2 may be greater than or equal to 2 degrees and less than or equal to 20 degrees ($2°≤A1≤20°$). According to some embodiments of the present disclosure, the included angle A2 between the first direction D1 and the third direction D3 may be greater than or equal to 2 degrees and less than or equal to 20 degrees ($2°≤A2≤20°$).

As shown in FIG. 5, the end of the second portion 2111b of the first bonding pads 2111 may be separated from the lower edge 10LE of the working area 10 by a distance S5; and the end of the third portion 2111c of the first bonding pads 2111 may be separated from the lower edge 10LE of the working area 10 by a distance S6.

For example, the bonding pad of the second portion 2111b of the first bonding pads 2111 that is closest to the side 21WS of the bonding area 21 is separated from the lower edge 10LE of the working area 10 by a minimum distance S5 in a direction that is perpendicular to the first direction D1 (e.g., the fourth direction D4); the bonding pad of the third portion 2111c of the first bonding pads 2111 that is closest to the side 50WS of the bonding area 21 is separated from the lower edge 10LE of the working area 10 by a minimum distance S6 in a direction that is perpendicular to the first direction D1 (e.g., in the fourth direction D4).

According to some embodiments of the present disclosure, the distance S5 between the end of the second portion 2111b of the first bonding pads 2111 and the lower edge 10LE of the working area 10 may be equal to the distance S6 between the end of the third portion 511c of the first bonding pads 2111 and the lower edge 10LE of the working area 10 (S5=S6).

According to some embodiments of the present disclosure, the distance S5 between the end of the second portion 2111b of the first bonding pads 2111 and the lower edge 10LE of the working area 10 may be greater than the distance S6 between the end of the third portion 511c of the first bonding pads 2111 and the lower edge 10LE of the working area 10 (S5>S6).

According to some embodiments of the present disclosure, the distance S5 between the end of the second portion 2111b of the first bonding pads 2111 and the lower edge 10LE of the working area 10 may be smaller than the distance S6 between the end of the third portion 511c of the first bonding pads 2111 and the lower edge 10LE of the working area 10 (S5<S6).

Please continue to refer to FIG. 5, the second bonding pads 2121 may be disposed close to the lower edge 21LE of the bonding region 21, and the second bonding pads 2121 may be arranged along the first direction D1.

As shown in FIG. 5, the second bonding pads 2121 may be separated from the lower edge 10 LE of the working area 10 by a distance S7. For example, the lower edge of the second bonding pads 2121 and the lower edge 10 LE of the working area 10 is separated by a minimum distance S7 in a direction that is perpendicular to the first direction D1 (e.g., the fourth direction D4).

As shown in FIG. 5, according to some embodiments of the present disclosure, the distance S7 between the lower edge of the second bonding pads 2121 and the lower edge 10 LE of the working area 10 may be greater than or equal to the distance S5 between the end of the second portion 2111b of the first bonding pads 2111 and the lower edge 10LE of the working area 10; and the distance S5 between the end of the second portion 2111b of the first bonding pads 2111 and the lower edge 10LE of the working area 10 may be greater than 0 micrometers (0 micrometers<S5≤S7).

According to some embodiments of the present disclosure, the distance S7 between the lower edge of the second bonding pads 2121 and the lower edge 10 LE of the working area 10 may be greater than or equal to the distance S5 between the end of the second portion 2111b of the first bonding pads 2111 and the lower edge 10LE of the working area 10; and the distance S5 between the end of the second portion 2111b of the first bonding pads 2111 and the lower edge 10LE of the working area 10 may be greater than or equal to 600 micrometers (600 micrometers≤S5≤S7).

As shown in FIG. 5, according to some embodiments of the present disclosure, the distance S7 between the lower edge of the second bonding pads 2121 and the lower edge 10 LE of the working area 10 may be greater than or equal to the distance S6 between the end of the third portion 511c of the first bonding pads 2111 and the lower edge 10LE of the working area 10. Moreover the distance S6 between the end of the third portion 511c of the first bonding pads 2111 and the lower edge 10LE of the working area 10 may be greater than 0 micrometers (0 micrometers<S6≤S7).

According to some embodiments of the present disclosure, the distance S7 between the lower edge of the second bonding pads 2121 and the lower edge 10 LE of the working area 10 may be greater than or equal to the distance S6 between the end of the third portion 511c of the first bonding pads 2111 and the lower edge 10LE of the working area 10. Moreover the distance S6 between the end of the third portion 511c of the first bonding pads 2111 and the lower edge 10LE of the working area 10 may be greater than or equal to 600 micrometers (600 micrometers≤S6≤S7).

Please continue to refer to FIG. 5, at least part of the first dummy pads 213 may be disposed between the first bonding pads 2111 and the working area 10. The second dummy pads 214 may be disposed between the first bonding pads 2111 and the second bonding pads 2121. The first portion 213a of the first dummy pads 213 may be disposed adjacent to the upper edge 21UE of the bonding area 21, and the first portion 213a of the first dummy pads 213 may be disposed between the second portion 2111b of the first bonding pads 2111 and the working area 10.

The second portion 213b of the first dummy pads 213 may be disposed adjacent to the upper edge 21UE of the bonding area 21, and the second portion 213b of the first dummy pads 213 may be disposed between the third portion 2111c of the first bonding pads 2111 and the working area 10. According to some embodiments of the present disclosure, the first portion 213a and/or the second portion 213b of the first dummy pads 213 may be arranged along the first direction D1.

Figure 6:
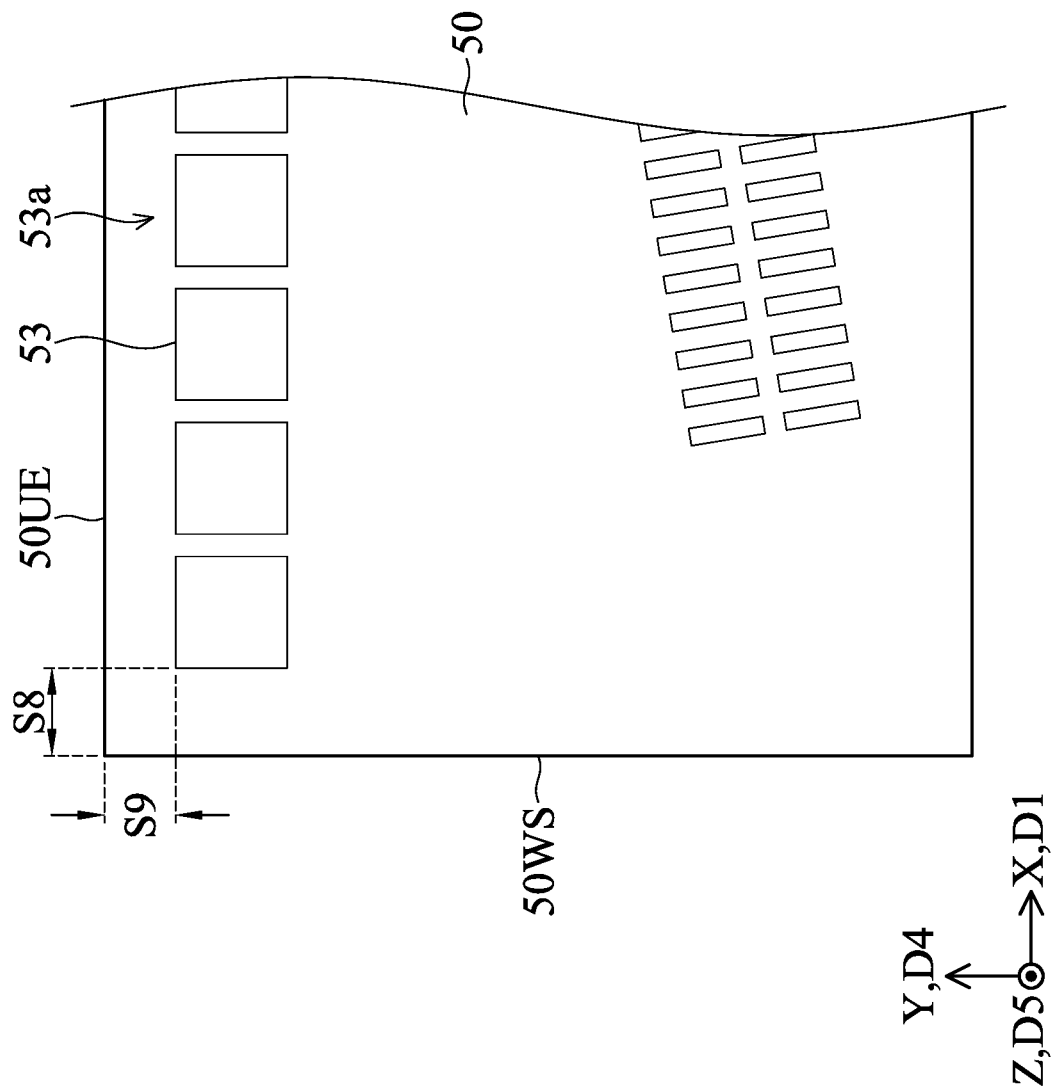
FIG. 6 shows a partial enlarged view of the bonding pads of the driving circuit of the electronic device of FIG. 4 according to some embodiments of the present disclosure, wherein a part of the first dummy bonding pads is shown.

Please refer to FIG. 6. FIG. 6 shows a partial enlarged view of the bonding pads of the driving circuit of the electronic device 100 of FIG. 4 according to some embodiments of the present disclosure, wherein a part of the first dummy bonding pads 53 is shown.

As shown in FIG. 6, the end of the first portion 53a of the first dummy pads 53 may be separated from the side 50WS of the driving circuit 50 by a distance S8. For example, the bonding pad of the first portion 53a of the first dummy pads 53 that is closest to the side 50WS of the driving circuit 50 is separated from the side 50WS of the driving circuit 50 by a minimum distance S8 in the first direction D1. Moreover, the distance S8 between the end of the first portion 53a of the first dummy pads 53 and the side 50WS of the driving circuit 50 may be greater than 0 micrometers (S8>0 micrometers).

According to some embodiments of the present disclosure, the distance S8 between the end of the first portion 53a of the first dummy pads 53 and the side 50WS of the driving circuit 50 may be greater than or equal to 200 micrometers (S8≥200 micrometers).

Referring to FIG. 6, the first portion 53a of the first dummy pads 53 may be separated from the upper edge 50UE of the driving circuit 50 by a distance S9. For example, the bonding pad of the first portion 53a of the first dummy pads 53 that is closest to the side 50WS of the driving circuit 50 is separated from the upper side of the driving circuit 50 in a direction that is perpendicular to the first direction D1 (e.g., the fourth direction D4). Also, the distance S9 between the first portion 53a of the first dummy pads 53 and the upper edge 50UE of the driving circuit 50 may be greater than 0 micrometers (S9>0 micrometers).

According to some embodiments of the present disclosure, the distance S9 between the first portion 53a of the first dummy pads 53 and the upper edge 50UE of the driving circuit 50 may be greater than 200 micrometers (S9≥200 micrometers).

Likewise, although not shown in the figures, the end of the second portion 53b of the first dummy pads 53 may be separated from the other side 50WS of the driving circuit 50 by a distance. Also, the distance between the end of the second portion 53b of the first dummy pads 53 and the other side 50WS of the driving circuit 50 may be greater than 0 micrometers (>0 micrometers).

According to some embodiments of the present disclosure, the distance between the end of the second portion 53b of the first dummy pads 53 and the other side 50WS of the driving circuit 50 may be greater than 200 micrometers (≥200 micrometers).

The second portion 53b of the first dummy pads 53 may be separated from the upper edge 50UE of the driving circuit 50 by a distance. Also, the distance between the second portion 53b of the first dummy pads 53 and the upper edge 50UE of the driving circuit 50 may be greater than 0 micrometers (>0 micrometers).

According to some embodiments of the present disclosure, the distance between the second portion 53b of the first dummy pads 53 and the upper edge 50UE of the driving circuit 50 may be greater than 200 micrometers (≥200 micrometers).

Figure 7:
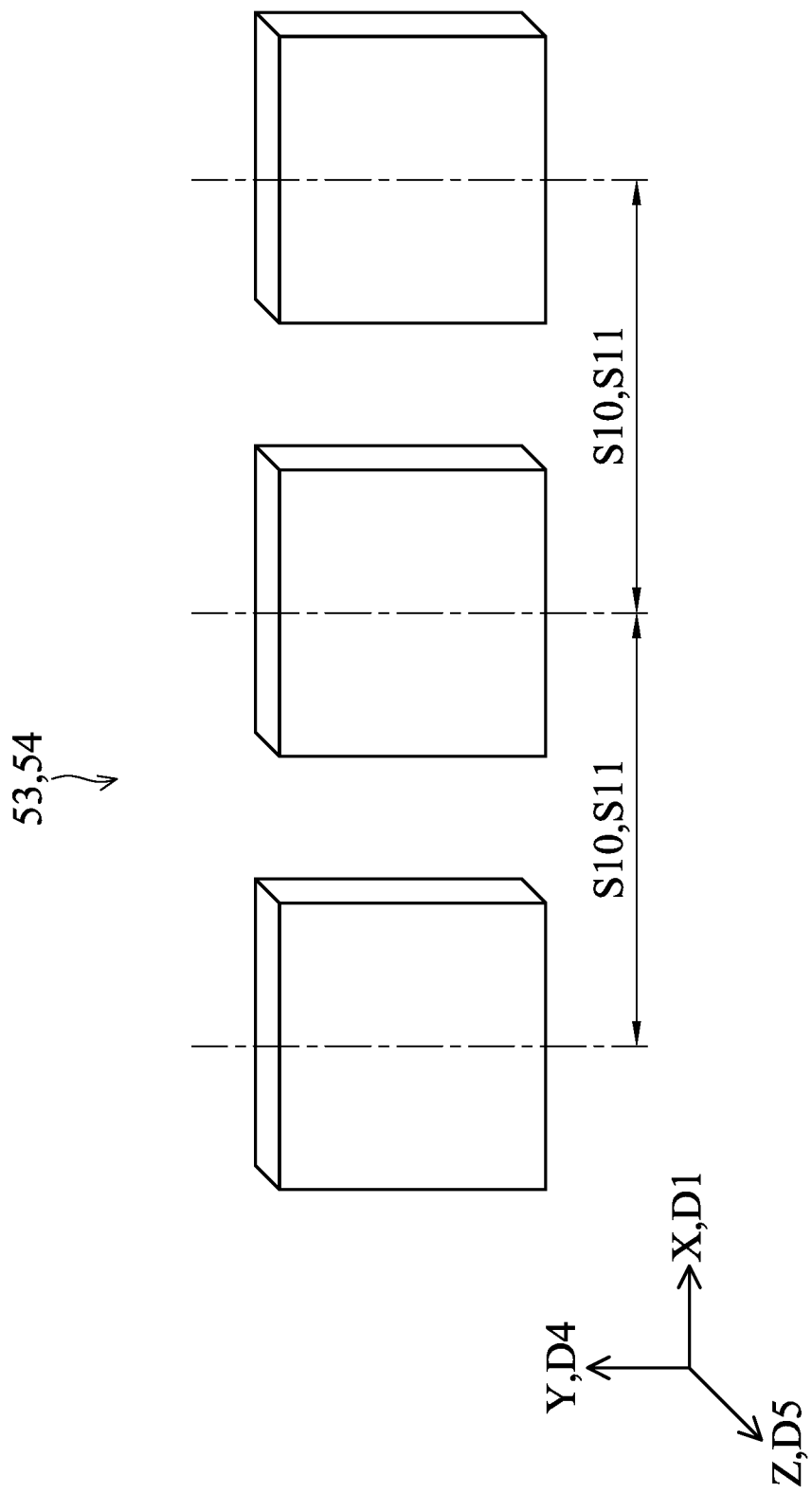
FIG. 7 shows a schematic view of the first dummy pads or the second dummy pads according to some embodiments of the present disclosure.

Please refer to FIG. 7, FIG. 7 shows a schematic view of the first dummy pads 53 or the second dummy pads 54 according to some embodiments of the present disclosure. As shown in FIG. 7, according to some embodiments of the present disclosure, each of the first dummy pads 53 may have a rectangular shape, such as a square shape. According to some embodiments of the present disclosure, each of the first dummy pads 53 may be a square with its side length greater than or equal to 44 micrometers. In other embodiments, the first dummy pads 53 may have a non-rectangular pattern, but the present disclosure is not limited thereto.

According to some embodiments of the present disclosure, the distance S10 between two adjacent first dummy pads 53 may be greater than 0 and less than or equal to 200 micrometers (0<S10≤200 micrometers). For example, the distance S10 is the distance between the centers of two adjacent first dummy pads 53.

According to some embodiments of the present disclosure, the distance S10 between two adjacent first dummy pads 53 may be greater than or equal to 88 micrometers and less than or equal to 200 micrometers (88 micrometers≤S10≤200 micrometers).

Please continue to refer to FIG. 4, according to some embodiments of the present disclosure, the second dummy pads 54 may be arranged along the first direction D1.

According to some embodiments of the present disclosure, the second dummy pads 54 may be disposed between the first bonding pads 511 and the second bonding pads 521. According to some embodiments of the present disclosure, the second dummy pads 54 may be disposed between the first portion 511a of the first bonding pads 511 and the second bonding pads 521. According to some embodiments of the present disclosure, the second dummy pads 54 may be arranged along the first direction D1.

According to some embodiments of the present disclosure, the distance between the second dummy pads 54 and the first portion 511a of the first bonding pads 511 (e.g., the minimum distance in the fourth direction D4) may be equal to the distance between the second dummy pads 54 and the second the bonding pads 521 (e.g., the minimum distance in the fourth direction D4). That is, according to some embodiments of the present disclosure, the second dummy pads 54 may be disposed between the first portion 511a of the first bonding pads 511 and the second bonding pads 521.

According to some embodiments of the present disclosure, the distance between the second dummy pads 54 and the first portion 511a of the first bonding pads 511 may be greater or smaller than the distance between the second dummy pads 54 and the second bonding pads 521, but the present disclosure is not limited thereto.

According to some embodiments of the present disclosure, a portion of the second dummy pads 54 may be disposed between the second portion 511b of the first bonding pads 511 and the second bonding pads 521. According to some embodiments of the present disclosure, a portion of the second dummy pads 54 may be disposed between the third portion 511c of the first bonding pads 511 and the second bonding pads 521, but the present disclosure is not limited thereto.

However, according to some embodiments of the present disclosure, the second dummy pads 54 may not be disposed between the second portion 511b of the first bonding pads 511 and the second bonding pads 521. According to some embodiments of the present disclosure, the second dummy pads 54 may not be disposed between the third portion 511c of the first bonding pads 511 and the second bonding pads 521.

Please continue to refer to FIG. 4, according to some embodiments of the present disclosure, the second dummy pads 54 may be disposed between the second portion 511b of the first bonding pads 511 and the third portion 511c of the first bonding pads 511.

However, according to some embodiments of the present disclosure, the second dummy pads 54 may not be disposed between the second portion 511b of the first bonding pads 511 and the third portion 511c of the first bonding pads 511.

Please refer to FIG. 7, according to some embodiments of the present disclosure, each of the second dummy pads 54 may have a rectangular shape, such as a square shape. According to some embodiments of the present disclosure, each of the second dummy pads 54 may be a square with its side length greater than or equal to 44 micrometers. In other embodiments, the second dummy pads 54 may have a non-rectangular pattern, but the present disclosure is not limited thereto.

According to some embodiments of the present disclosure, the distance S11 between two adjacent second dummy pads 54 may be greater than 0 and less than or equal to 400 micrometers (0<S11≤400 micrometers). For example, the distance S11 is the distance between the centers of two adjacent second dummy pads 54.

As shown in FIG. 7, according to some embodiments of the present disclosure, the distance S11 between two adjacent second dummy pads 54 may be greater than or equal to 88 micrometers and less than or equal to 400 micrometers (88 micrometers≤S11≤400 micrometers).

Figure 8:
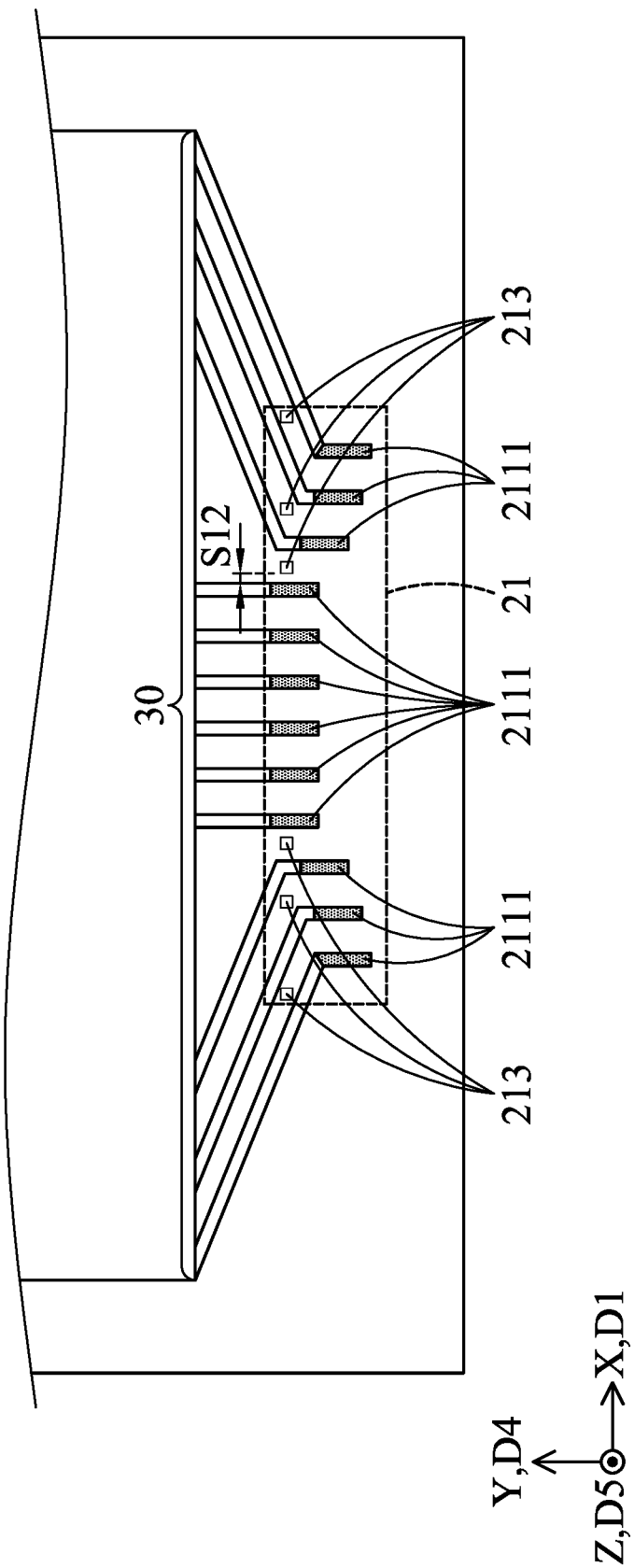
FIG. 8 shows an enlarged view of the lower part of the electronic device of FIG. 1 according to some embodiments of the present disclosure, wherein a part of the first dummy pads is particularly shown.

Please refer to FIG. 8, FIG. 8 shows an enlarged view of the lower part of the electronic device 100 of FIG. 1 according to some embodiments of the present disclosure, wherein a part of the first dummy pads 213 is particularly shown.

As shown in FIG. 8, the wire 30 may be connected to the working area 10 and the first bonding pads 2111. For example, the wire 30 may electrically connect the working area 10 and the first bonding pads 2111 to each other, so as to allow current and/or signal transmission between the working area 10 and the first bonding pads 2111.

Please continue to refer to FIG. 8, when viewed along a fifth direction D5 (for example, the Z axis or the normal direction of the electronic device) that is perpendicular to the first direction D1 and the fourth direction D4, the wire 30 may not overlap the first dummy pads 213.

The wire 30 is separated from the closest first dummy pads 213 by a minimum distance S12 when viewed along the fifth direction D5.

According to some embodiments of the present disclosure, the minimum distance S12 between the wire 30 and the closest first dummy pads 213 may be greater than 0 (S12>0). According to some embodiments of the present disclosure, the minimum distance S12 between the wire 30 and the closest first dummy pads 213 may be greater than or equal to 6 micrometers (S12≥6 micrometers).

The electronic device 100 of the disclosed embodiment may shorten the distance S1 between the lower edge of the working area 10 and the lower edge of the peripheral area 20. Therefore, the electronic device 100 of the embodiment of the present disclosure may have the effect of miniaturizing the peripheral area 20.

The electronic device 100 of the embodiment of the present disclosure may improve the problems of deformation, cracking, stress concentration, and uneven pressure of the driving circuit 50, so that the electronic device 100 has better reliability.

It should be noted that the features of the various embodiments of the present disclosure may be arbitrarily mixed and matched as long as they do not violate the spirit of the disclosure or conflict with each other.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
a substrate, comprising a bonding area;
a plurality of first bonding pads, disposed on the substrate, and disposed in the bonding area; and
a plurality of first dummy pads, disposed on the substrate, and disposed in the bonding area,
wherein a part of the plurality of first bonding pads are arranged along a first direction, and another part of the plurality of first bonding pads are arranged along a second direction, and
wherein there is an included angle between the first direction and the second direction, and the included angle is greater than 0 degrees and less than 90 degrees,
wherein the substrate further comprises a working area, and the plurality of first dummy pads are disposed between the working area and the another part of the plurality of first bonding pads.

2. The electronic device as claimed in claim 1, wherein: the included angle is greater than or equal to 2 degrees and less than or equal to 20 degrees.

3. The electronic device as claimed in claim 1, wherein: the plurality of first dummy pads are arranged along the first direction.

4. The electronic device as claimed in claim 1, further comprising:
a plurality of wires, disposed on the substrate, wherein the plurality of wires connects the working area and the first bonding pads,
wherein the electronic device has a normal direction, the plurality of wires are not overlapped with the plurality of first dummy pads when viewed along the normal direction.

5. The electronic device as claimed in claim 4, wherein:
when viewed along the normal direction, at least one of the plurality of wires is separated from the closest first dummy pad by a distance, and the distance is greater than or equal to 6 micrometers.

6. The electronic device as claimed in claim 1, further comprising a plurality of second bonding pads and a plurality of second dummy pads disposed on the substrate, and disposed in the bonding area,
wherein the plurality of second bonding pads are disposed farther away from the working area than the plurality of first bonding pads, and
wherein the plurality of second dummy pads are disposed between the plurality of first bonding pads and the plurality of second bonding pads.

7. The electronic device as claimed in claim 6, wherein the plurality of second bonding pads are arranged along the first direction.

8. The electronic device as claimed in claim 7, further comprising a driving circuit, wherein:
a distance between the plurality of first bonding pads and the plurality of second bonding pads is greater than or equal to 500 micrometers.

9. The electronic device as claimed in claim 8, wherein:
the distance between the plurality of first bonding pads and the plurality of second bonding pads is less than or equal to a width of the driving circuit.

10. The electronic device as claimed in claim 8, wherein:
the distance between the plurality of first bonding pads and the plurality of second bonding pads is less than or equal to half of the width of the driving circuit.

11. The electronic device as claimed in claim 1, wherein:
a third portion of the plurality of first bonding pads is arranged along a third direction, and
there is a second included angle between the first direction and the third direction, and the second included angle is greater than 0 degrees and less than 90 degrees.

12. The electronic device as claimed in claim 11, wherein:
the second included angle between the first direction and the third direction is greater than or equal to 2 degrees and less than or equal to 20 degrees.

13. The electronic device as claimed in claim 1, wherein:
a ratio of a width of the bonding area to a width of the working area is between 0.172 and 0.258.

14. The electronic device as claimed in claim 1, wherein:
a distance between a lower edge of the working area and a lower edge of a peripheral area is less than 3200 micrometers.

15. The electronic device as claimed in claim 1, further comprising a driving circuit,
wherein a distance between the plurality of first dummy pads and a side of the driving circuit is greater than or equal to 200 micrometers.

16. The electronic device as claimed in claim 15, wherein:
a distance between the plurality of first dummy pads and an upper edge of the driving circuit is greater than 200 micrometers.

17. The electronic device as claimed in claim 15, wherein:
a distance between two adjacent first dummy pads is greater than or equal to 88 micrometers.

18. The electronic device as claimed in claim 17, wherein:
the distance between two adjacent first dummy pads is less than or equal to 200 micrometers.

19. The electronic device as claimed in claim 15, further comprising:
a plurality of wires, disposed on the substrate, wherein the plurality of wires connects the working area and the plurality of first bonding pads,
wherein a minimum distance between one of the plurality of wires and the closest first dummy pads is greater than or equal to 6 micrometers.

* * * * *